(12) United States Patent  
Ruotolo

(10) Patent No.: US 10,642,400 B2  
(45) Date of Patent: May 5, 2020

(54) POSITION AND MAGNETIC FIELD SENSORS

(71) Applicant: City University of Hong Kong, Kowloon (HK)

(72) Inventor: Antonio Ruotolo, Kowloon (HK)

(73) Assignee: City University of Hong Kong, Kowloon (HK)

( * ) Notice: Subject to any disclaimer, the term of this patent is extended or adjusted under 35 U.S.C. 154(b) by 85 days.

(21) Appl. No.: 15/823,142

(22) Filed: Nov. 27, 2017

(65) Prior Publication Data

US 2019/0163309 A1  May 30, 2019

(51) Int. Cl.
| | |
|---|---|
| *G06F 3/041* | (2006.01) |
| *H01L 43/02* | (2006.01) |
| *G01R 33/02* | (2006.01) |
| *G01R 33/07* | (2006.01) |
| *G06F 3/0354* | (2013.01) |

(52) U.S. Cl.  
CPC ........... *G06F 3/0414* (2013.01); *G01R 33/02* (2013.01); *G01R 33/07* (2013.01); *H01L 43/02* (2013.01); *G06F 3/03547* (2013.01)

(58) Field of Classification Search  
USPC .......................................................... 324/260  
See application file for complete search history.

(56) References Cited

U.S. PATENT DOCUMENTS

| | | | |
|---|---|---|---|
| 2012/0049843 A1* | 3/2012 | Sun ...................... | G01R 33/098 324/249 |
| 2015/0034902 A1* | 2/2015 | Jorgenson ........... | H01L 21/0237 257/13 |
| 2016/0139695 A1* | 5/2016 | Chase ................. | G06F 3/03547 345/174 |

* cited by examiner

*Primary Examiner* — Vincent Q Nguyen  
(74) *Attorney, Agent, or Firm* — Norton Rose Fulbright US LLP

(57) ABSTRACT

Systems and methods which provide a semiconductor with thin metallic film deposition sensor configuration are described. Thin metallic film semiconductor sensors of embodiments may be utilized in determining various impingements upon the sensor surface, such as from objects touching, hovering near, or light sources illuminating a sensor surface. Embodiments of a thin metallic film deposition semiconductor sensor provide a non-resistive, non-capacitive sensor configuration operable for determining position of various objects, including both electrically conductive objects and non-electrically conductive objects. A semiconductor with thin metallic film sensor of embodiments may additionally or alternatively provide a magnetic field sensor configuration operable for determining magnitude and/or direction with respect to a magnetic field.

26 Claims, 5 Drawing Sheets

POSITION AND MAGNETIC FIELD SENSORS

TECHNICAL FIELD

The present invention relates generally to sensors and, more particularly, to sensors for detecting position with respect to an object and/or magnetic field direction.

BACKGROUND OF THE INVENTION

Various sensors have been used for detecting position of an object, such as a stylus or a finger, in a plane. For example, trackpads have become a common form of position detection sensor used with computing devices, such as for providing a digital pointer interface for the user. Such trackpads typically comprise a relatively small rectangular planar sensor surface well suited for integration in portable computers (e.g., laptop computers, notebook computers, personal digital assistants (PDAs), etc.) and other devices (e.g., keyboard assemblies).

The first generation of trackpads was based on local resistive change in the sensor due to pressure of an object touching a sensor surface of the trackpad. An advantage of this technology is that the object for which position is determined (i.e., the object touching the sensor surface, such as a stylus or finger) does not need to be a conductor, such as may accommodate the use of various items as a stylus (e.g., erasure tipped pencil, gloved hand of a user, etc.). However, a disadvantage of this technology is the relatively low sensitivity (e.g., the range of pressure at which object position is detected is small) of the sensor configuration. A further disadvantage of this technology is that an object must be touching a sensing surface of the trackpad, with sufficient pressure, for position to be detected.

The second, current generation of trackpads is based on local change of capacitance due to redistribution of static charge on the touching object. An advantage of this technology is high sensitivity (i.e., sensitivity significantly higher than that of the foregoing first generation trackpads). However, a disadvantage of this technology is that the object used to touch the sensor for position determination must be an electric conductor (e.g., only suitably electrically conductive configurations of stylus, uncovered hand of a user, etc. touching the sensor surface may detected by the sensor).

As can be appreciated from the foregoing, both the first generation trackpad local resistive technology and the second generation local capacitance technology require an object touching a sensor surface for detecting position. Accordingly, neither technology provides for contact-less position detection (i.e., neither technology can trace the position of a collimated light illuminating the sensor surface or of an object hovering above the sensor surface).

BRIEF SUMMARY OF THE INVENTION

The present invention is directed to systems and methods which provide a semiconductor with thin metallic film deposition (referred to herein as "thin metallic film semiconductor") sensor configuration, such as may be utilized in determining various impingements (e.g., objects touching, objects hovering near, light sources illuminating, etc.) upon a sensor surface thereof. Configurations of thin metallic film semiconductor sensor configurations may be used in various applications, such as to provide a trackpad or other object position detection sensor device. Embodiments of a thin metallic film deposition semiconductor sensor provide a non-resistive, non-capacitive sensor configuration operable for determining position of various objects, including both electrically conductive objects and non-electrically conductive objects. Additionally or alternatively, a thin metallic film deposition semiconductor sensor of embodiments provides a non-contact sensor configuration operable for determining position of an object not in contact with a surface of the sensor, such as an object hovering in close proximity to the sensor surface, and/or operable for determining position of a spot of light illuminating a surface of the sensor, such as collimated light provided by a light source not in contact with the sensor but illuminating a surface of the sensor. A semiconductor with thin metallic film sensor of embodiments may additionally or alternatively provide a magnetic field sensor configuration operable for determining magnitude and/or direction with respect to a magnetic field applied to a surface of the sensor.

Embodiments of a thin metallic film semiconductor sensor comprise an ultra-thin metallic film deposited on a semiconductor. A sensor surface of a thin metallic film semiconductor sensor may, for example, be provided by an area of a semiconductor substrate covered by the ultra-thin metallic film, wherein the sensor surface area may be of any suitable shape and size. The foregoing ultra-thin metallic film of embodiments provides a metal deposition that is optically transparent, semi-transparent, translucent, or otherwise light permeable. For example, the thickness of the metallic film as deposited on the semiconductor is smaller than a light penetration depth, such that light can penetrate the metallic film and reach the interface between the metal of the metallic film and the underlying semiconductor.

The metal of the metallic film of embodiments of a thin metallic film semiconductor sensor forms a Schottky contact to the semiconductor substrate. In operation according to embodiments of the invention, light is absorbed at the interface between the thin metallic film and the semiconductor substrate and excites a charge in the metal. The density of static charge in the metal increases with light intensity. In uniform light conditions, such as ambient light, this static charge is uniformly distributed on the metal of the metallic film and no difference of potential exists between the edges of the thin metallic film semiconductor sensor. However, where light is non-uniformly distributed, such as due to a spot source of light or a point of shadowing the ambient light, the static charge density is correspondingly non-uniformly distributed. Likewise, where a surface of the metallic film a thin metallic film semiconductor sensor is touched by an object, such as a stylus or user's finger, the static charge density is non-uniformly distributed. Accordingly, embodiments of a thin metallic film semiconductor sensor utilizes static charge density difference information in detecting the position of an object in contact and/or non-contact modes of operation.

In a contact mode of operation of embodiments of a thin metallic film semiconductor sensor, where an object (e.g., an electrically conductive or non-electrically conductive object) touches the surface of the thin metallic film, static charge density is locally reduced at a point of contact, a difference of potential will appear transverse to the metallic film sensor surface. For example, the static charge density of the metal will be reduced along the x-direction proportionally to the x-position of the point of contact of the object and along the y-direction proportionally to the y-position of the point of contact of the object.

In a non-contact mode of operation of embodiments of a thin metallic film semiconductor sensor, where an object does not touch a surface of the thin metallic film, static charge density is locally reduced at a point of spot illumination or shadowing. If a collimated light illuminates a spot on the surface of the thin metallic film at position (x,y), static charge is locally increased such that a difference of potential will appear transverse to the metallic film sensor surface. For example, the static charge density of the metal will be increased along the x-direction proportionally to the x-position of the point of spot illumination and along the y-direction proportionally to the y-position of the point of spot illumination. Similarly, if an object shadows the ambient light at a point on the surface of the thin metallic film at position (x,y), static charge is locally decreased such that a difference of potential will appear transverse the metallic film sensor surface. For example, the static charge density of the metal will be decreased along the x-direction proportionally to the x-position of the point of shadowing and along the y-direction proportionally to the y-position of the point of shadowing.

In uniform light conditions, if a magnetic field is applied in the plane of the thin metallic film of a thin metallic film semiconductor sensor of embodiments herein, the charge will accumulate on one or more edges of the metal. Accordingly, in a magnetic field mode of operation of embodiments of a thin metallic film semiconductor sensor, where a magnetic field is applied to a surface of the sensor, a difference of potential appears transverse to the metallic film sensor surface. For example, a charge will accumulate along the x-direction that is linearly proportional to the x-component of the magnetic field and along the y-direction that is linearly proportional to the y-component of the magnetic field. In operation according to embodiments, a thin metallic film semiconductor sensor operating in a magnetic field mode is biased by light, and not biased by current. Accordingly, the constant of proportionality (i.e., sensitivity) of a thin metallic film semiconductor sensor operating in a magnetic field mode according to embodiments of the invention depends on the light intensity.

From the foregoing it can be appreciated that a thin metallic film semiconductor sensor of embodiments, utilizing static charge density difference information for object position detection, provides a non-resistive, non-capacitive sensor configuration. Also as can be appreciated from the foregoing, embodiments of a thin metallic film semiconductor sensor enable position detection with respect to electrically conductive and non-electrically conductive objects in both a contact and non-contact mode of operation. Moreover, a thin metallic film semiconductor sensor configuration of embodiments provides a magnetic field mode operable to detect magnetic field direction.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1A:
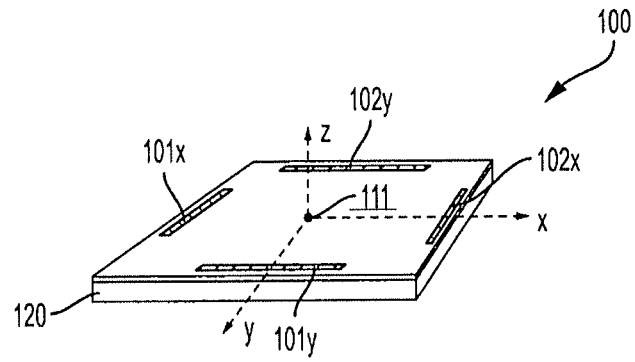
FIGS. 1A-1C show a thin metallic film semiconductor sensor in accordance with embodiments of the invention.
Figure 1B:
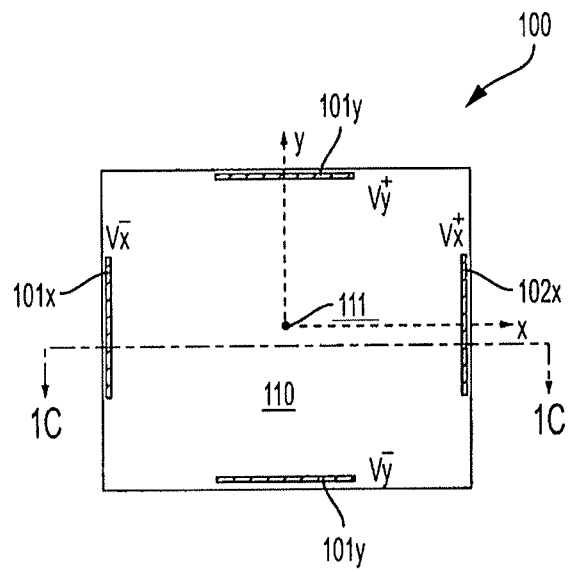
Figure 1C:
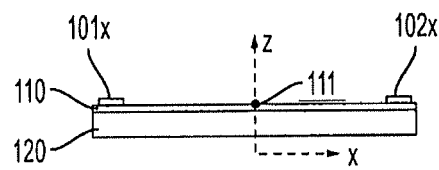

An embodiment of a semiconductor with thin metallic film deposition sensor is shown as thin metallic film semiconductor sensor 100 in FIGS. 1A-1C. In particular, an embodiment of thin metallic film semiconductor sensor 100 is shown in perspective view in FIG. 1A, in a top plan view in FIG. 1B, and in cross-sectional elevation view in FIG. 1C.

Thin metallic film semiconductor sensor 100 of the illustrated embodiment comprises thin metallic film 110, such as may comprise a sensor surface of a thin film formed from metals with high work-function $\Phi$ such as platinum, gold, nickel, etc., deposited on semiconductor 120, such as may comprise a sensor substrate formed from highly-resistive semiconductors, such as intrinsic silicon, intrinsic gallium arsenide, etc. For example, thin metallic film 110 may be a thin metallic film with resistivity $\rho$ and work-function $\Phi$ deposited (e.g., using one or more of an electrodeposition, sputtering, chemical vapor deposition, etc. process(es)) on semiconductor 120 with energy-gap $E_g$ to form a Schottky interface.

Thin metallic film 110 of embodiments of thin metallic film semiconductor sensor 100 is configured to provide a metal deposition that is optically transparent, semi-transparent, translucent, or otherwise light permeable. For example, thin metallic film 110 may comprise an ultra-thin metallic film wherein the thickness of the metallic film is smaller than the light penetration depth of the metal of thin metallic film 110 so that light can penetrate the metal of thin metallic film 110 and reach the interface of thin metallic film 110 and semiconductor 120.

Figure 2:
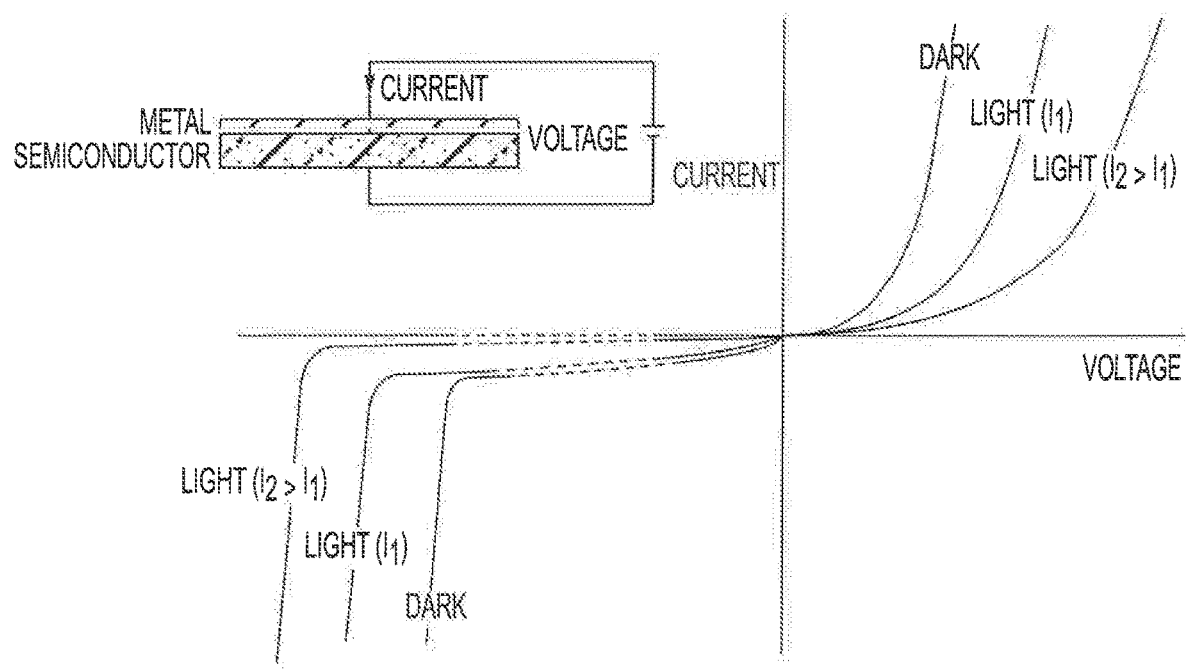
FIG. 2 shows the transverse current-voltage characteristic in dark and for increasing light intensities of the thin metallic film semiconductor sensor configuration of FIGS. 1A-1C.

Semiconductor 120 of embodiments can absorb light of wavelengths longer than $\lambda = hc/E_g$, where h=Plank's constant, c=speed of light in vacuum, and $E_g$=the gap energy of the thin metallic film and semiconductor interface. Accordingly, the thickness of the metal of thin metallic film 110 may be chosen for wavelengths longer than $\lambda$ to be smaller than the light penetration depth $\delta = \sqrt{(\rho\lambda/\pi\mu c)}$, where $\rho$ and $\mu$ are the resistivity and magnetic permeability of the metal, respectively. It should be appreciated that, although no bias-current is needed in operation of embodiments of thin metallic film semiconductor sensor 100 of embodiments, the current-voltage characteristics of the diode may nevertheless be measured in the dark and for increasing light intensity to verify the aforementioned conditions. (FIG. 2 shows the transverse current-voltage characteristic in dark and for increasing light intensities of an exemplary implementation of thin metallic film semiconductor sensor 100. As can be seen in the graphs of FIG. 2, for a given voltage, in both forward and reverse bias, the current increases with light intensity for light with wavelengths longer than $\lambda$. Likewise, for a given current, in both forward and reverse bias, the voltage increases with light intensity for light with wavelengths longer than $\lambda$.

Embodiments of semiconductor 120 may comprise a semiconductor material of any desired thickness determined to provide both a suitable substrate for the thin metallic film. Semiconductor 120 of embodiments presents a surface upon which thin metallic film 110 is deposited that is sufficiently smooth to facilitate establishing the aforementioned Schottky interface with respect to the thin metallic film. For example, semiconductor 120 may comprise a surface which approximates an atomically flat surface (e.g., having a roughness on the order of 0.1 nm or less) upon which the thin metallic film is deposited.

Referring again to FIG. 1, thin metallic film semiconductor sensor 100 of the illustrated embodiment further comprises two pairs of opposite electrical contacts disposed along the edges of thin metallic film 110. In particular, thin metallic film semiconductor sensor 100 includes electrical contacts 101x and 102x forming a pair of electrical contacts disposed on a surface of thin metallic film 110 and at opposite edges of thin metallic film 110 for the x-axis and electrical contacts 101y and 102y forming a pair of electrical contacts disposed on the surface of thin metallic film 110 and at opposite edges of thin metallic film 110 for the y-axis. According to embodiments of thin metallic film semiconductor sensor 100 electrical contacts 101x, 102x, 101y, and 102y are configured for detecting static charge density difference information used in object position detection according to embodiments of the invention. Accordingly, for each pair of the foregoing electrical contacts of embodiments, the two electrical contacts of a pair are equidistant from the thin metallic film semiconductor sensor's center (datum point 111) along the respective axes (i.e., x-axis for electrical contacts 101x and 102x and y-axis for electrical contacts 101y and 102y).

Figure 3:
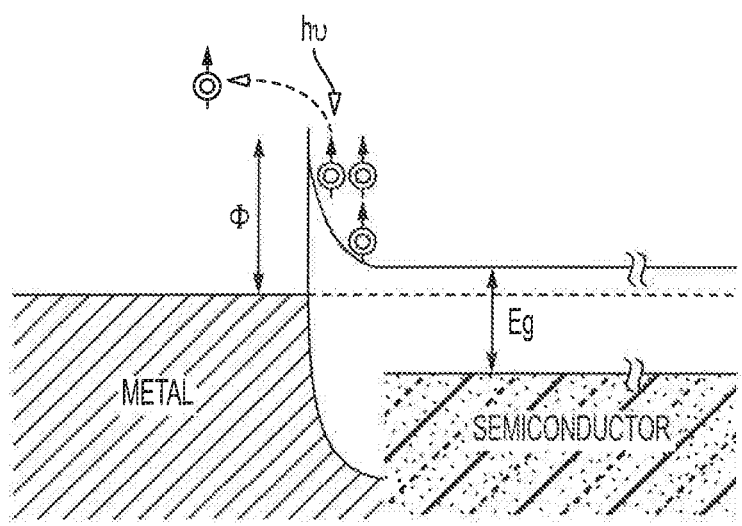
FIG. 3 shows the energy-band diagram of the thin metallic film semiconductor sensor of embodiments of the invention.

When thin metallic film semiconductor sensor 100 is not biased (i.e., no bias voltage or bias current is applied), light is absorbed by semiconductor 120 and charge is transferred in the metal of thin metallic film 110, as depicted in the energy-band diagram of FIG. 3. That is, in zero-bias condition, light absorption transfers charge in the metal of the thin metallic film semiconductor sensor wherein, at equilibrium, a static charge density exists in the metal. In uniform light conditions (e.g., typical ambient light conditions), the static charge density is uniformly distributed on the metal of the thin metallic film semiconductor sensor. However, impingement upon the sensor surface, such as by an object touching the sensor surface, a spot illuminated on the sensor surface, or, an object hovering in close proximity and shadowing the sensor surface, results in the static charge density being non-uniformly distributed on the metal of the thin metallic film semiconductor sensor. Accordingly, in operation according to embodiments, the open-circuit voltage measured between each pair of electrical contacts of thin metallic film semiconductor sensor 100 is proportional to a position of impingement (e.g., point at which an object is touching the sensor surface, a point over which an object is hovering in close proximity to the sensor surface, a point at which a spot is illuminated on the sensor surface, or a point at which a point is shadowed on the sensor surface) along the respective axis. That is, the open-circuit voltage measured between electrical contacts 101x and 102x is linearly proportional to the x-axis component of a point of touch, hover, illumination, or shadow impingement on the sensor surface. Likewise, the open-circuit voltage measured between electrical contacts 101y and 102y is linearly proportional to the y-axis component of a point of touch, hover, illumination, or shadow impingement on the sensor surface.

In addition to or in alternative to the foregoing impingement position determination operation, embodiments of thin metallic film semiconductor sensor 100 provide magnetic field determination operation. For magnetic field sensing, the open-circuit voltage measured between each pair of electrical contacts of thin metallic film semiconductor sensor 100 is proportional to the strength of a magnetic field applied in the plane of the sensor surface. That is, the open-circuit voltage measured between electrical contacts 101x and 102x is linearly proportional to the x-axis component of the magnetic field. Likewise, the open-circuit voltage measured between electrical contacts 101y and 102y is linearly proportional to the y-axis component of the magnetic field. In operation according to embodiments, thin metallic film semiconductor sensor 100 operating in a magnetic field mode is biased by light, and not biased by current. Accordingly, the constant of proportionality (i.e., sensitivity) of a thin metallic film semiconductor sensor operating in a magnetic field mode according to embodiments of the invention depends on the light intensity.

It can be appreciated from the foregoing that thin metallic film semiconductor sensor 100 of embodiments provides a non-resistive, non-capacitive sensor device that may be utilized in sensing the 2-dimensional position of an object hovering in proximity to a sensing surface thereof, the 2-dimensional position of an object touching a sensing surface thereof, whether the object is electrically insulating or conducting, the 2-dimensional position of a light source illuminating a sensing surface thereof, and/or the strength and direction of a magnetic field applied in the plane of a sensing surface thereof. Such a position sensor device may be utilized in a number of applications, such as in a trackpad providing a digital pointer interface in computing and other devices (e.g., laptop computers, notebook computers, PDAs, keyboard assemblies, Internet appliances, Internet of Things (IoT) devices, navigation devices, touch screens, etc.).

Having described thin metallic film semiconductor sensor 100 in accordance with embodiments of the invention, various exemplary systems in which such a position sensor device may be utilized will be described with reference to FIGS. 4 and 5. In particular, FIG. 4 shows a position determination system and FIG. 5 shows a magnetic field determination system, each including an implementation of thin metallic film semiconductor sensor 100.

Figure 4:
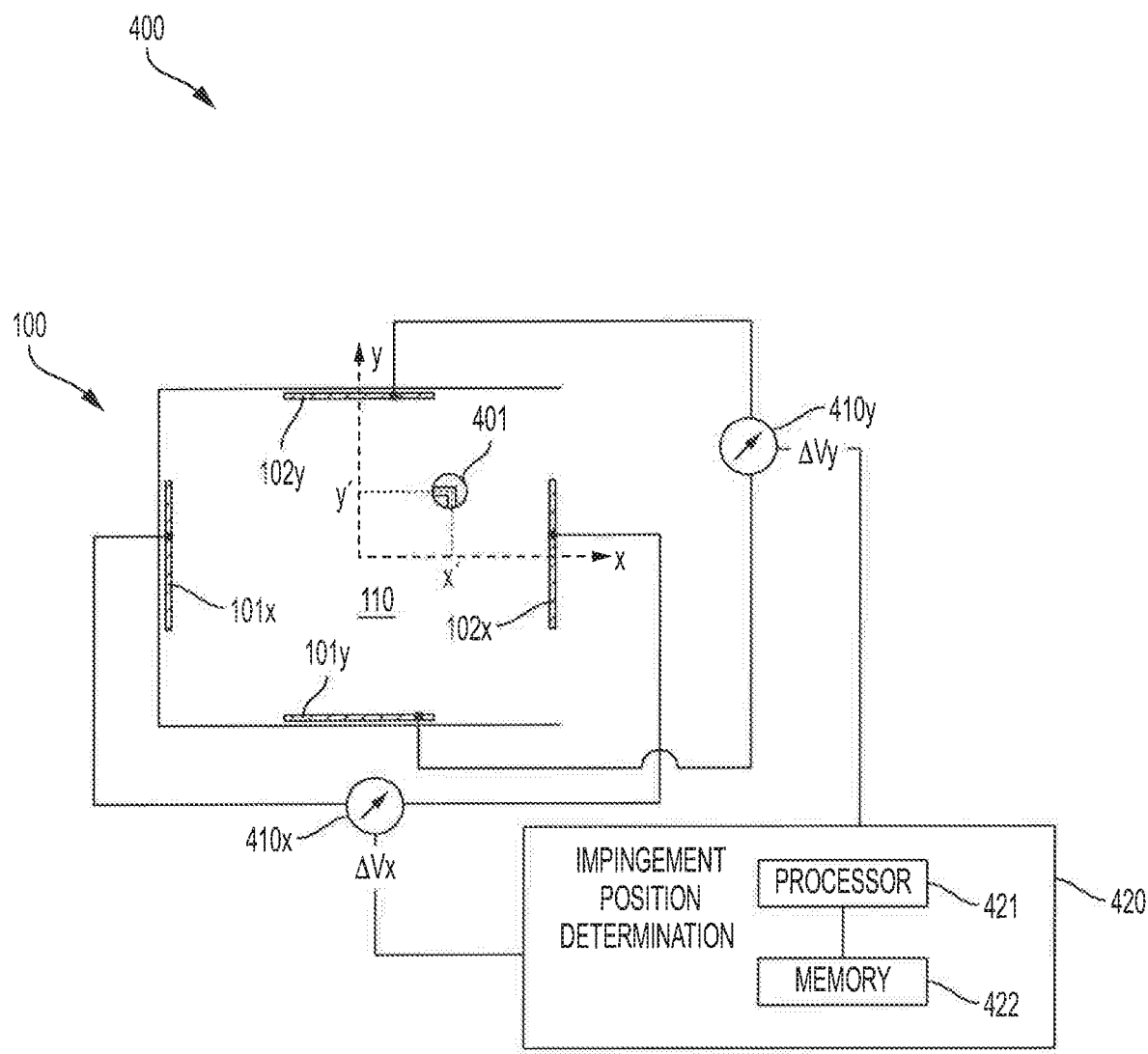
FIG. 4 shows a position determination system implemented using a thin metallic film semiconductor sensor in accordance with embodiments of the invention.
Figure 5:
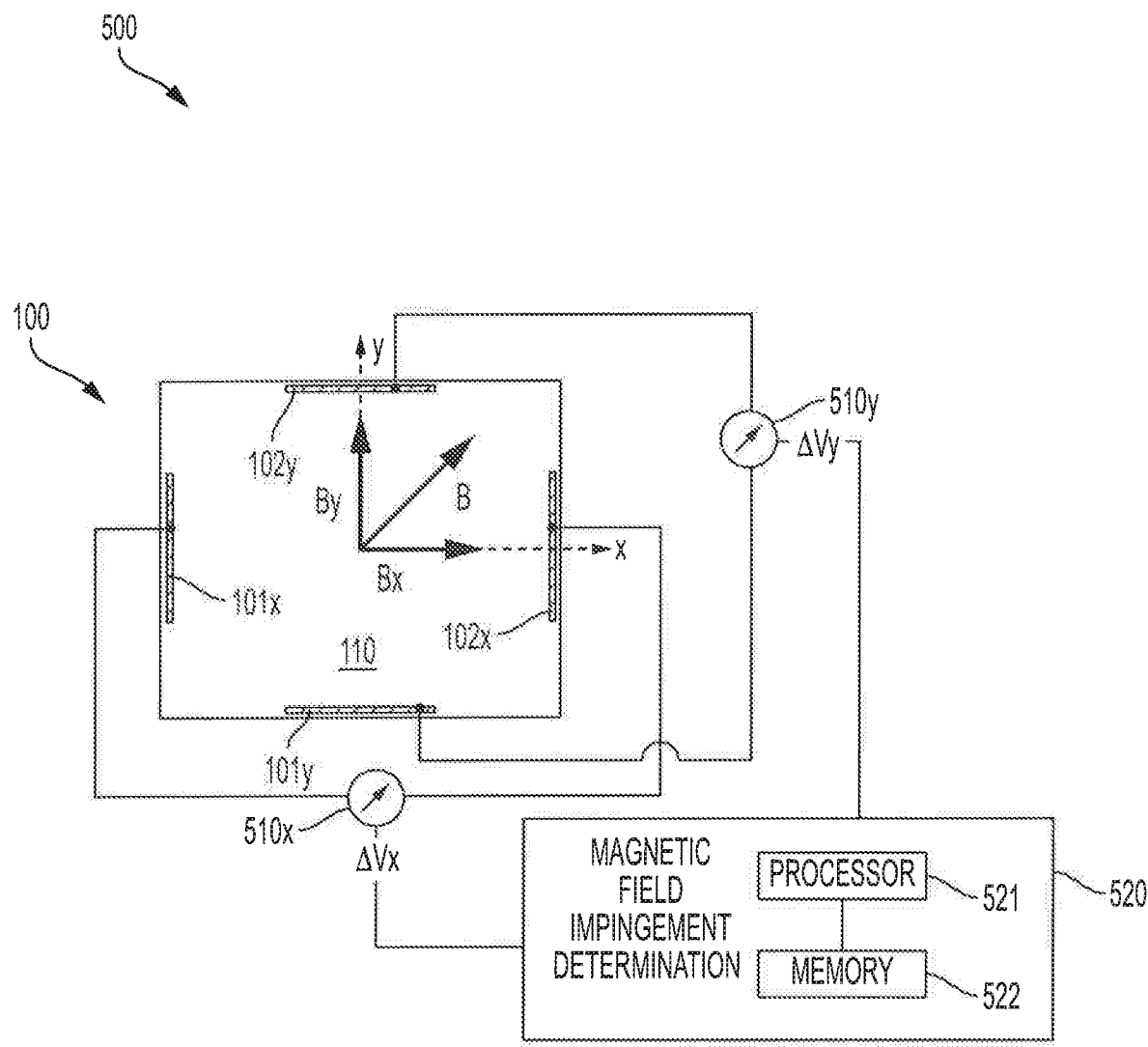
FIG. 5 shows a magnetic field determination system implemented using a thin metallic film semiconductor sensor in accordance with embodiments of the invention.

FIG. 4 shows position determination system 400 comprising thin metallic film semiconductor sensor 100 coupled to impingement position determination logic 420 via potential difference measurement circuits 410x and 410y. Potential difference measurement circuits 410x and 410y of embodiments comprise measurement circuits (e.g., digital voltage meters, analog voltage meters, etc.) configured to measure open-circuit voltage between a corresponding pair of electrical contacts of thin metallic film semiconductor sensor 100 (e.g., potential difference measurement circuit 410x measuring x-axis voltage difference $\Delta V_x$ between electrical contacts 101x and 102x and potential difference measurement circuit 410y measuring y-axis voltage difference ΔVy between electrical contacts 101y and 102y). Impingement position determination logic 420 of embodiments includes logic circuits configured to determine an impingement position upon a sensor surface of thin metallic film semiconductor sensor 100 from potential difference measurement information provided by potential difference measurement circuits 410x and 410y. For example, impingement position determination logic 420 of embodiments comprises processor 421 (e.g., one or more of a general purpose processor, an application specific integrated circuit (ASIC), a programmable gate array (PGA), a system on chip (SOC), and/or the like), such as may be operable under control of an instruction set defining logic for performing position determinations herein, as may be stored in memory 422 (e.g., random access memory (RAM), read only memory (ROM), flash memory, disk memory, optical memory, and/or the like). Such logic circuits of impingement position determination logic 420 may determine x-axis and y-axis offset components (x' and y', respectively) with respect to a center of the sensor surface from the potential difference measurement information provided by potential difference measurement circuits 410x and 410y.

In operation of position determination system 400, impingement upon the sensor surface, such as by an object touching the sensor surface or an object hovering in close proximity and shadowing the sensor surface, results in a potential difference linearly proportional to the offset of the impingement position from the center of the sensor surface, as is measured for the x-axis by potential difference measurement circuit 410x and the y-axis by potential difference measurement circuit 410y. For example, a reduction of light intensity at impingement position 401, such as from a point shadowed on the sensor surface from an object touching the sensor surface or hovering near the sensor surface, results in a reduction of light density at that same position. This local reduction in light penetration results in a corresponding local change static charge density. If the metal of thin metallic film 110 has a non-zero resistance due to its ultra-thin thickness, charge will not redistribute uniformly. Accordingly, a difference of potential (ΔVx, ΔVy) will appear transverse to the sensor surface that can be measured in open-circuit conditions, wherein ΔVx will be proportional to the sensor surface center offset x-axis coordinate x' and ΔVy will be proportional to the sensor surface center offset y-axis coordinate y'. The position of this impingement upon the sensor surface can be measured by position determination system 400 by measuring the voltage transverse to the sensor surface along the x- and y-axis using potential difference measurement circuits 410x and 410y, providing the potential difference measurements (e.g., ΔVx, ΔVy) to impingement position determination logic 420, and logic circuits of impingement position determination logic 420 computing sensor center offset coordinates (x',y') from which impingement position 401 is derived.

In a further example of the operation of position determination system 400, impingement upon the sensor surface, such as by a spot illuminated on the sensor surface, results in a potential difference linearly proportional to the offset of the impingement position from the center of the sensor surface, as is measured for the x-axis by potential difference measurement circuit 410x and the y-axis by potential difference measurement circuit 410y. For example, a collimated light illuminating the sensor surface at impingement position 401 results in an increase in light density at that same position. This local increase in light penetration results in a corresponding local change static charge density. Accordingly, a difference of potential (−ΔVx, −ΔVy) will appear transverse to the sensor surface that can be measured in open-circuit conditions, wherein ΔVx will be proportional to the sensor surface center offset x-axis coordinate x' and ΔVy will be proportional to the sensor surface center offset y-axis coordinate y'. The position of this impingement upon the sensor surface can be measured by position determination system 400 as described above. It should be appreciated, however, that local reduction of light intensity and local increase of light intensity result in open-circuit voltages of opposite sign.

FIG. 5 shows magnetic field determination system 500 comprising thin metallic film semiconductor sensor 100 coupled to magnetic field impingement determination logic 520 via potential difference measurement circuits 510x and 510y. Potential difference measurement circuits 510x and 510y of embodiments comprise measurement circuits (e.g., digital voltage meters, analog voltage meters, etc.), such as may be the same as or similar to potential difference measurement circuits 410x and 410y discussed above. Accordingly, potential difference measurement circuits 510x and 510y of embodiments are configured to measure open-circuit voltage between a corresponding pair of electrical contacts of thin metallic film semiconductor sensor 100 (e.g., potential difference measurement circuit 510x measuring x-axis voltage difference ΔVx between electrical contacts 101x and 102x and potential difference measurement circuit 510y measuring y-axis voltage difference ΔVy between electrical contacts 101y and 102y). Magnetic field impingement determination logic 520 of embodiments includes logic circuits configured to determine a magnitude and/or direction of a magnetic field impinging upon a sensor surface of thin metallic film semiconductor sensor 100 (e.g., a magnetic field applied in the plane of the thin metallic film semiconductor sensor) from potential difference measurement information provided by potential difference measurement circuits 510x and 510y. For example, magnetic field impingement determination logic 520 of embodiments comprises processor 521 and memory 522, such as may be the same as or similar to processor 421 and memory 422 discussed above. Processor 521 (e.g., one or more of a general purpose processor, an ASIC, a PGA, a SOC, and/or the like), such as may be operable under control of an instruction set defining logic for performing magnetic field determinations herein, as may be stored in memory 522 (e.g., RAM, ROM, flash memory, disk memory, optical memory, and/or the like). Such logic circuits of magnetic field impingement determination logic 520 may determine magnetic field x-axis and y-axis components ($B_x$ and $B_y$, respectively) from the potential difference measurement information provided by potential difference measurement circuits 510x and 510y.

In operation of magnetic field determination system 500, impingement of a magnetic field B upon the sensor surface, such as by a magnetic field applied in the plane of the thin metallic film semiconductor sensor 100, results in a potential difference linearly proportional to the magnitude and direction of the magnetic field, as is measured for the x-axis by potential difference measurement circuit 510x and the y-axis by potential difference measurement circuit 510y. For example, when a magnetic field impinges upon a sensor surface of thin metallic film semiconductor sensor 100 charge accumulates on the edges of the thin metallic film. Accordingly, a difference of potential (ΔVx, ΔVy) appears along the x-axis that is linearly proportional to the x-component ($B_x$) of the magnetic field (B) and the y-axis that is linearly proportional to the y-component ($B_y$) of the magnetic field (B). In the foregoing operation for sensing magnetic fields, charges photo-excited in the space-charge region of the Schottky contact between the semiconductor and the thin metallic film are injected in the metal at high energy/velocity, and the magnetic field impinging upon the thin metallic film semiconductor sensor bends the trajectory of the charge because of Lorentz forces. Accordingly, charges with opposite sign accumulate on opposite edges of the thin metallic film. Thus, a difference of potential ($\Delta Vx$, $\Delta Vy$) will appear transverse to the sensor surface that is proportional to the component of the magnetic field in the respective axes (i.e., $\Delta Vx$ in the x-axis and $\Delta Vy$ in the y-axis).

It should be appreciated from the foregoing exemplary operation of magnetic field determination system 500 of FIG. 5 that embodiments of thin metallic film semiconductor sensor 100 may be utilized to perform the same function as that of semiconducting Hall-sensor. However, because thin metallic film semiconductor sensor 100 implemented in accordance with embodiments herein does not utilize a current-bias, no Joule heating is dissipated. Thus, embodiments of thin metallic film semiconductor sensors provide sensor implementations that are more energy efficient and/or dissipate less heat into the system environment than do conventional sensor configurations.

The foregoing exemplary embodiments are described herein to aid in the understanding of the concepts of the present invention and are not intended as a limitation on the scope or applicability of those concepts or the invention herein. Accordingly, embodiments consistent with the concepts herein, although implementing various alterations with respect to the examples described above, are nevertheless included within the scope of the present invention. For example, although example embodiments of thin metallic film semiconductor sensors have been shown with reference to a rectangular shape, embodiments may be implemented having any arbitrary shape suitable for detecting differences of potential as described herein. As a further example, although example embodiments of thin metallic film semiconductor sensors have been described with reference to light reaching the interface between a thin metallic film and semiconductor substrate by penetrating the thin metallic film, light may reach the interface from either or both the thin metallic film or the semiconductor substrate (e.g., through a translucent, semi-transparent, or transparent semiconductor).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sensor comprising:
a semiconductor substrate;
a metallic film deposited on a surface of the semiconductor substrate, wherein the metallic film forms a first sensor surface of the sensor;
a first pair of electrical contacts disposed on the first sensor surface and equidistant from a datum point of the first sensor surface and along a first axis, wherein the first pair of electrical contacts are configured to provide a first axis component of difference of potential information regarding impingement sensed by the sensor; and
a second pair of electrical contacts disposed on the first sensor surface and equidistant from the datum point of the first sensor surface and along a second axis, wherein the first and second axes are orthogonal, wherein the second pair of electrical contacts are configured to provide a second axis component of difference of potential information regarding impingement sensed by the sensor.

2. The sensor of claim 1, wherein a thickness of the metallic film as deposited on the semiconductor substrate is smaller than a light penetration depth of light having wavelengths longer than a selected wavelength λ such that light having a wavelength longer than the selected wavelength λ penetrates the metallic film and reaches an interface between the metallic film and the semiconductor substrate.

3. The sensor of claim 1, wherein the semiconductor substrate, the metallic film, the first pair of electrical contacts, and the second pair of electrical contacts operate cooperatively to provide non-resistive and non-capacitive sensing of the impingement.

4. The sensor of claim 3, wherein the impingement sensed by the sensor comprises an object touching the first sensor surface, wherein the first axis component of difference of potential information is linearly proportional to a position of the object touching the first sensor surface along the first axis, and wherein the second axis component of difference of potential information is linearly proportional to a position of the object touching the first sensor surface along the second axis.

5. The sensor of claim 3, wherein the impingement sensed by the sensor comprises an object hovering above the first sensor surface, wherein the first axis component of difference of potential information is linearly proportional to a position of the object above the first sensor surface along the first axis, and wherein the second axis component of difference of potential information is linearly proportional to a position of the object above the first sensor surface along the second axis.

6. The sensor of claim 3, wherein the impingement sensed by the sensor comprises a light illuminating a spot on the first sensor surface, wherein the first axis component of difference of potential information is linearly proportional to a position of the spot on the first sensor surface along the first axis, and wherein the second axis component of difference of potential information is linearly proportional to a position of the spot on the first sensor surface along the second axis.

7. The sensor of claim 3, wherein the impingement sensed by the sensor comprises a magnetic field applied to the first sensor surface, wherein the first axis component of difference of potential information is linearly proportional to a magnitude of the magnetic field along the first axis, and wherein the second axis component of difference of potential information is linearly proportional to a magnitude of the magnetic field along the second axis.

8. The sensor of claim 7, wherein the sensor is biased by light and is not biased by current, and wherein a sensitivity of magnetic field impingement sensing provided by the sensor is proportional to an intensity of the light biasing the sensor.

9. The sensor of claim 1, wherein the datum point of the first sensor surface is a center point of the first sensor surface.

10. The sensor of claim 1, further comprising:
one or more potential difference measurement circuits coupled to the first pair of electrical contacts and the second pair of electrical contacts and configured to determine a difference of potential ($\Delta V_1$) for the first pair of electrical contacts and a difference of potential ($\Delta V_2$) for the second pair of electrical contacts.

11. The sensor of claim 10, further comprising:
impingement position determination logic coupled to the one or more potential difference measurement circuits and configured to obtain the difference of potential ($\Delta V_1$) for the first pair of electrical contacts and the difference of potential ($\Delta V_2$) for the second pair of electrical contacts and determine a position of the impingement therefrom.

12. The sensor of claim 10, further comprising:
magnetic field impingement determination logic coupled to the one or more potential difference measurement circuits and configured to obtain the difference of potential ($\Delta V_1$) for the first pair of electrical contacts and the difference of potential ($\Delta V_2$) for the second pair of electrical contacts and determine at least one of magnitude or direction of a magnetic field impinging on the sensor therefrom.

13. A method for sensing impingement on a first sensor surface of a sensor, the method comprising:
detecting a difference of potential for a first axis of the first sensor surface resulting from the impingement on the first sensor surface using an open-circuit voltage measurement between a first pair of electrical contacts disposed on the first sensor surface and equidistant from a datum point of the first sensor surface, wherein the first sensor surface comprises a metallic film deposited on a surface of a semiconductor substrate; and
detecting a difference of potential for a second axis of the first sensor surface resulting from the impingement on the first sensor surface using an open-circuit voltage measurement between a second pair of electrical contacts disposed on the first sensor surface and equidistant from the datum point of the first sensor surface, wherein the first and second axes are orthogonal.

14. The method of claim 13, wherein a thickness of the metallic film as deposited on the semiconductor substrate is smaller than a light penetration depth of light having wavelengths longer than a selected wavelength $\lambda$ such that light having a wavelength longer than the selected wavelength $\lambda$ penetrates the metallic film and reaches an interface between the metallic film and the semiconductor substrate.

15. The method of claim 13, further comprising:
determining a two-dimensional position of the impingement on the first sensor surface using the difference of potential for the first axis of the first sensor surface and the difference of potential for the second axis of the first sensor surface.

16. The method of claim 15, wherein the impingement on the first sensor surface comprises an object touching the first sensor surface, wherein the difference of potential for the first axis of the first sensor surface is linearly proportional to a position of the object touching the first sensor surface along the first axis, and wherein the difference of potential for the second axis of the first sensor surface is linearly proportional to a position of the object touching the first sensor surface along the second axis.

17. The method of claim 15, wherein the impingement on the first sensor surface comprises shadowing from an object hovering above the first sensor surface, wherein the difference of potential for the first axis of the first sensor surface is linearly proportional to a position of the shadowing along the first axis, and wherein the difference of potential for the second axis of the first sensor surface is linearly proportional to a position of the shadowing along the second axis.

18. The method of claim 15, wherein the impingement on the first sensor surface comprises a light illuminating a spot on the first sensor surface, wherein the difference of potential for the first axis of the first sensor surface is linearly proportional to a position of the spot on the first sensor surface along the first axis, and wherein the difference of potential for the second axis of the first sensor surface is linearly proportional to a position of the spot on the first sensor surface along the second axis.

19. The method of claim 13, further comprising:
determining a magnitude and direction of the impingement on the first sensor surface using the difference of potential for the first axis of the first sensor surface and the difference of potential for the second axis of the first sensor surface.

20. The method of claim 19, wherein the impingement on the first sensor surface comprises a magnetic field applied to the first sensor surface, wherein the difference of potential for the first axis of the first sensor surface is linearly proportional to a magnitude of the magnetic field along the first axis, and wherein the difference of potential for the second axis of the first sensor surface is linearly proportional to a magnitude of the magnetic field along the second axis.

21. The method of claim 20, wherein the sensor is biased by light and is not biased by current, and wherein a sensitivity of magnetic field impingement sensing provided by the sensor is proportional to an intensity of the light biasing the sensor.

22. A system for sensing impingement on a sensor surface of a sensor, the system comprising:
a sensor assembly comprising:
a semiconductor substrate;
a metallic film deposited on a surface of the semiconductor substrate, wherein the metallic film forms a sensor surface of the sensor;
a first pair of electrical contacts disposed equidistant from a datum point of the sensor surface and along a first axis, wherein the first pair of electrical contacts are configured to provide a first axis component of difference of potential information regarding impingement sensed by the sensor; and
a second pair of electrical contacts disposed equidistant from the datum point of the sensor surface and along a second axis, wherein the first and second axes are orthogonal, wherein the second pair of electrical contacts are configured to provide a second axis component of difference of potential information regarding impingement sensed by the sensor;
one or more potential difference measurement circuits coupled to the first pair of electrical contacts and the second pair of electrical contacts and configured to determine a difference of potential ($\Delta V_1$) for the first pair of electrical contacts and a difference of potential ($\Delta V_2$) for the second pair of electrical contacts; and impingement attribute determination logic coupled to the one or more potential difference measurement circuits and configured to obtain the difference of potential ($\Delta V_1$) for the first pair of electrical contacts and the difference of potential ($\Delta V_2$) for the second pair of electrical contacts and determine one or more attributes of the impingement therefrom.

23. The system of claim 22, wherein the one or more attributes of the impingement comprise a position of the impingement, and wherein the impingement attribute determination logic comprises impingement position determination logic configured to determine the position of the impingement from the difference of potential ($\Delta V_1$) for the first pair of electrical contacts and the difference of potential ($\Delta V_2$) for the second pair of electrical contacts.

24. The system of claim 22, wherein the one or more attributes of the impingement comprise at least one of magnitude or direction of a magnetic field of the impingement, and wherein the impingement attribute determination logic comprises magnetic field impingement determination logic configured determine the at least one of magnitude or direction of the magnetic field impinging on the sensor from the difference of potential ($\Delta V_1$) for the first pair of electrical contacts and the difference of potential ($\Delta V_2$) for the second pair of electrical contacts.

25. The system of claim 22, wherein a thickness of the metallic film as deposited on the semiconductor substrate is smaller than a light penetration depth of light having wavelengths longer than a selected wavelength $\lambda$ such that light having a wavelength longer than the selected wavelength $\lambda$ penetrates the metallic film and reaches an interface between the metallic film and the semiconductor substrate.

26. The system of claim 22, wherein the sensor assembly comprises a trackpad sensor configured to provide non-resistive and non-capacitive sensing of user input.

* * * * *